United States Patent [19]
Tanaka et al.

[11] Patent Number: 5,549,995
[45] Date of Patent: Aug. 27, 1996

[54] PHOTOMASK AND METHOD OF MANUFACTURING THE SAME

[75] Inventors: Satoshi Tanaka, Kawasaki; Soichi Inoue; Hiroko Nakamura, both of Yokohama, all of Japan

[73] Assignee: Kabushiki Kaisha Toshiba, Kawasaki, Japan

[21] Appl. No.: 402,656

[22] Filed: Mar. 13, 1995

[30] Foreign Application Priority Data

Mar. 15, 1994 [JP] Japan .................................. 6-043618
Sep. 16, 1994 [JP] Japan .................................. 6-222190

[51] Int. Cl.$^6$ .................................. G03F 9/00
[52] U.S. Cl. .................. 430/5; 430/322; 430/323; 430/324
[58] Field of Search .................. 430/5, 322, 323, 430/324

[56] References Cited

U.S. PATENT DOCUMENTS 5,384,219  1/1995  Dao et al .................. 430/5

FOREIGN PATENT DOCUMENTS 62-189468  8/1987  Japan .

OTHER PUBLICATIONS

SPIE vol. 1927 Optical Laser Microlithography VI, pp.28–41; C. Pierrat et al. Mar. 1993.
J. Vac. Sci. Technol.B 10(6) pp.3055–3061; R. L. Kostelak et al. Nov/Dec 1992.

*Primary Examiner*—S. Rosasco
*Attorney, Agent, or Firm*—Oblon, Spivak, McClelland, Maier & Neustadt, P.C.

[57] ABSTRACT

A transmitting photomask includes an optically transparent substrate having a major surface on which a plurality of recesses are selectively formed and transmitting exposure light, a plurality of opaque materials formed on the portions of the major surface of the transparent substrate, other than the recesses and preventing the exposure light from passing therethrough, and a plurality of transmitting portions constituted of the recesses. Each of the recesses has side walls formed perpendicular to the major surface of the transparent substrate so as to substantially coincide with a corresponding end face of each of the opaque materials, and adjacent transmitting portions have different depths. A method of manufacturing a transmitting photomask, includes a step of forming an opaque film preventing exposure light from passing therethrough on an optically transparent substrate transmitting the exposure light, a step of forming a plurality of opening patterns for forming a transmitting portion on the opaque film and thus forming a plurality of opaque materials with remaining portions of the opaque film, and a step of forming a plurality of transmitting portions including recesses having different depths alternately by etching the transparent substrate through the opening patterns by use of anisotropic etching.

8 Claims, 7 Drawing Sheets

FIG. 10B 0.75μm LINE AND SPACE AT MASK

PHOTOMASK AND METHOD OF MANUFACTURING THE SAME

BACKGROUND OF THE INVENTION

1. Field of the Invention

The present invention relates to a photomask used for manufacturing a semiconductor integrated circuit and, more particularly, to a transmitting photomask utilizing a phase-shifting method and a method of manufacturing the same.

2. Description of the Related Art

Photolithography has recently made remarkable progress and a projection exposure system has improved in efficiency accordingly. The wavelength of exposure light from the projection exposure system has been shortened (for example, 365 nm of i-line and 248 nm of KrF excimer laser beam), and the NA (numerical aperture) of a lens of the system has been increased, with the result that a finer resist pattern can be formed on a wafer. The resolution and depth of focus of the projection exposure system has also been improved by an improvement in photomask and an super-resolution technique such as annular illumination.

It is known that the phases of light transmitted through adjacent two transparent portions on a mask can be caused to differ from each other to improve the resolution of the projection exposure system. A conventional mask pattern so formed is described in Marc D. Levenson et al., "Improving Resolution in Photolithography with a Phase-Shifting Mask," *IEEE Trans. on Electron Devices*, Vol. ED-29, No. 12 (1982), p. 1828. In this literature, a mask is formed so as to satisfy the following relation and serves as a shifter for changing one of the phases to the other:

$$dth=\lambda/\{2(n-1)\}$$

where dth is the thickness of the shifter, n is the refractive index, and k is the wavelength of exposure light. Since the light transmitted through the shifter has a phase opposite to that of the other transmitted light (a shift of 180 degrees), the light intensity becomes zero at a boundary of patterns, and the patterns are separated from each other, thus improving in resolution.

Figure 1A:
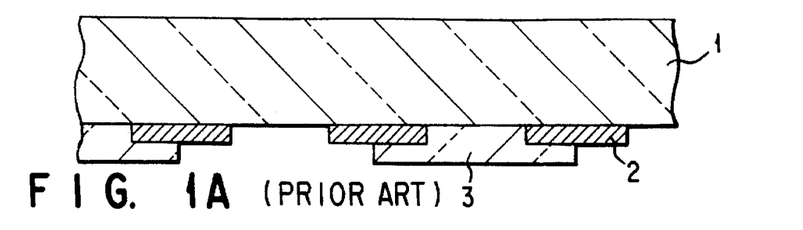
FIGS. 1A to 1D are cross-sectional views of conventional masks which allow high resolution by a phase-shifting method.

To form a mask capable of high resolution by the above phase-shifting method, as shown in FIG. 1A, there is a method of providing one of adjacent openings with a transparent medium whose refractive index differs from that of air (a shifter forming method), and the method is disclosed in, for example, Jpn. Pat. Appln. KOKAI Publication No. 58-173744. In FIG. 1A, reference numeral 1 indicates a transmitting substrate, numeral 2 shows an opaque material, and numeral 3 denotes a phase-shifting film. In the shifter forming method, it is difficult to form the phase-shifting mask having the same refractive index as that of the substrate with high accuracy, and there occurs a problem of multi-reflection on the phase-shifting film.

Figure 1B:
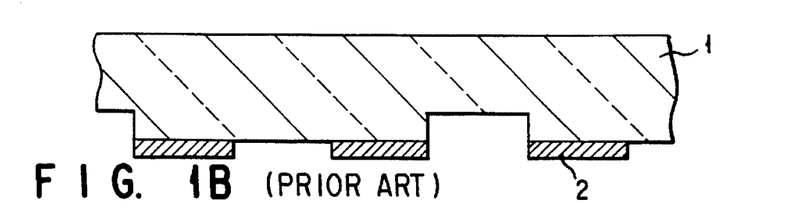

As shown in FIG. 1B, there is a subtractive process of forming a recess on a transparent substrate by etching or the like, and this process is disclosed in, for example, Jpn. Pat. Appln. KOKAI Publication No. 62-189468. With respect to the subtractive process, R. L. Kostelak et al., "Exposure Characteristics of Alternate Aperture Phase-Shifting Masks Fabricated Using a Subtractive Process," *J. Vac. Sci. Technol.* B 10(6), 1992, p. 3055 reports that, when a subtracted portion is formed by anisotropic etching, an amount of light transmitted therethrough is made smaller than that of light transmitted through a non-subtracted portion and thus the sizes of resist patterns, which are formed on a semiconductor wafer in correspondence with the subtracted and non-subtracted portions, differ from each other. More specifically, the former amount of light is made smaller than the latter amount by the influence of the side wall of the subtracted portion; accordingly, there occurs a difference in size between resist patterns corresponding to the subtracted and non-subtracted portions.

Figure 1C:
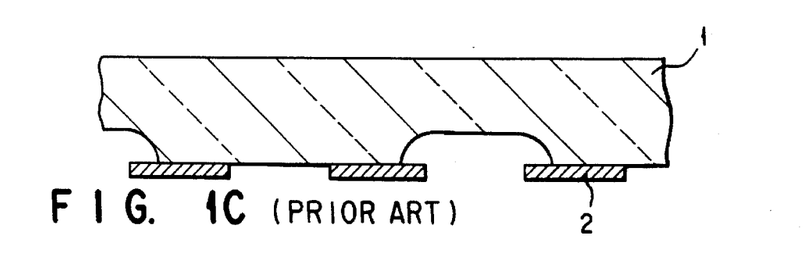

The above literature also reports, as shown in FIG. 1C, that the difference in resist sizes is lessened when the subtracted portion is formed by isotropic etching. Further, Christophe Pierrat et al., "Phase-Shifting Mask Topography Effects on Lithographic Image Quality," *SPIE.*, Vol. 1927 (1993), p. 28 proposes a method of lessening a difference in resist sizes by vertically subtracting a portion corresponding to a phase difference of 180 degrees from a substrate by anisotropic etching and then removing the side walls of the subtracted portion by isotropic etching, as illustrated in FIG. 1D.

Figure 1D:
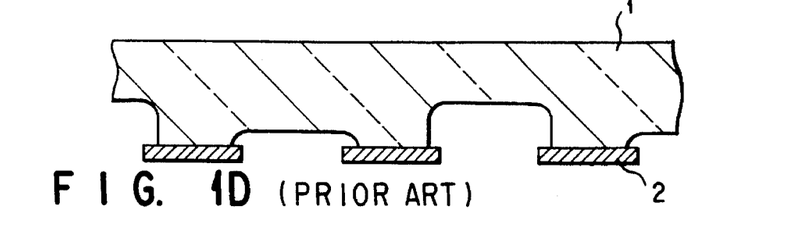

If the methods shown in FIGS. 1C and 1D are used, since a protrusion is formed of opaque material, the edge of an opaque portion is structurally weakened and this portion is chipped off in a step of cleaning a mask, thus causing a defect in finished products. Moreover, an amount of etching of the side walls of a subtracted portion, which is the most suitable for reducing a difference in resist sizes, varies with the size of an opening.

As described above, the conventional method of forming a photomask by a phase-shifting method has the following drawbacks. In the shifter forming method, a mask is difficult to form. In the subtracted method, there occurs a difference in size between resist patterns corresponding to subtracted and non-subtracted portions. In the process of shifting the side walls of a subtracted portion toward an opaque portion by isotropic etching to prevent a difference in resist sizes from occurring, the edge of the opaque portion is structurally weakened and easy to chip off.

SUMMARY OF THE INVENTION

An object of the present invention is to provide a photomask capable of transferring a high-resolution pattern by a phase-shifting method and a method of manufacturing the photomask and, more specifically, to a photomask of great mechanical strength which is easy to form by a subtracted method without using a phase-shifting mask, and which lessens a difference in size between resist patterns, caused on the side walls of a subtracted portion, and prevents a protrusion from being formed of an opaque material, and a method of manufacturing the photomask.

To attain the above object, according to a first aspect of the present invention, there is provided a transmitting photomask comprising:

an optically transparent substrate having a major surface on which a plurality of recesses are selectively formed and transmitting exposure light;

a plurality of opaque materials formed on portions of the major surface of the transparent substrate, other than the plurality of recesses, and preventing the exposure light from passing therethrough; and a plurality of transmitting portions constituted of the plurality of recesses, the plurality of recesses each having side walls formed perpendicular to the major surface of the transparent substrate so as to substantially coincide with a corresponding end face of each of the plurality of opaque materials, and adjacent transmitting portions having different depths.

According to a second aspect of the present invention, there is provided a method of manufacturing a transmitting photomask, comprising the steps of:

forming an opaque film preventing exposure light from passing therethrough on an optically transparent substrate transmitting the exposure light;

forming a plurality of opening patterns for forming a transmitting portion on the opaque film and thus forming a plurality of opaque materials with remaining portions of the opaque film; and forming a plurality of transmitting portions including recesses having different depths alternately by etching the transparent substrate through the plurality of opening patterns by use of anisotropic etching.

A preferred embodiment of the present invention is as follows:

(1) The phases of adjacent transmitting portions differ from each other.

(2) The phases of adjacent transmitting portions differ from each other by 180 degrees.

(3) When the depth of a recess of one of the adjacent transmitting portions is $D_1$ and that of a recess of the other portion is $D_2$, these depths are so determined as to satisfy the following equations:

$$D_1=(2m-1)\lambda/\{2(n-1)\}$$

$$D_2=m\lambda/(n-1)$$

where m is a positive integer, n is the refractive index of a transmitting substrate, and $\lambda$ is the wavelength of exposure light.

(4) when the depth to which the adjacent transmitting portions are subtracted by simultaneous etching is $d_1$, and the depth to which one of the adjacent transmitting portions is subtracted by etching to cause a phase difference between them is $d_2$, these depths are so determined as to satisfy the following equations:

$$d_1=D_1=(2m-1)\lambda/\{2(n-1)\}$$

$$d_2=D_2-D_1=\lambda/\{2(n=1)\}$$

(5) when the depth of a recess of one of the adjacent transmitting portions is $D_1$ and that of a recess of the other portion is $D_2$, these depths are set so as to implement the following equations:

$$D_1=\lambda/\{2(n-1)\}$$

$$D_2=2D_1$$

(6) When the depth of a recess of one of the adjacent transmitting portions is $D_1$ and that of a recess of the other portion is $D_2$, these depths are so determined as to satisfy the following relations:

$$|D_1-D_2|=(2m-1)\lambda/[2(n-1)]-\delta$$

$$0\leq\delta<\lambda/\{16(n-1)\}$$

where m is a positive integer, n is the refractive index of a transmitting substrate, and $\lambda$ is the wavelength of exposure light.

(7) When the depth of a recess of one of the adjacent transmitting portions is $D_1$ and that of a recess of the other portion is $D_2$, these depths are so determined as to satisfy the following relations:

$$D_1=(2m-1)\lambda/(2(n-1))+\delta1$$

$$D_2=m\lambda/(n-1)+\delta2$$

$$0\leq\delta1-\delta2<\lambda/(16(n-1)),$$

$$|\delta1|, |\delta2|<\lambda/\{16(n-1)\}$$

where m is a positive integer, n is the refractive index of a transmitting substrate, and $\lambda$ is the wavelength of exposure light. If $\delta1=\delta2=0$, the depths $D_1$ and $D_2$ are the same as those of (3).

(8) Reactive ion etching (RIE) is employed as anisotropic etching for etching a transparent substrate.

According to a third aspect of the present invention, there is provided a transmitting photomask comprising:

an optically transparent substrate for transmitting exposure light;

a plurality of opaque materials selectively formed on the transparent substrate, for preventing the exposure light from passing therethrough; and a plurality of transmitting portions selectively formed on the transparent substrate, for transmitting the exposure light, at least one of adjacent transmitting portions being shaped like a recess to cause a phase difference between exposure lights passing through the adjacent transmitting portions, and a thickness x of each of the plurality of opaque materials being set within a following range with respect to a wavelength $\lambda$ of the exposure light:

$$\lambda\leq x\leq 2\lambda$$

Another preferred embodiment of the present invention is as follows:

(1) In adjacent transmitting portions of subtracted and non-subtracted portions, the thickness x of an opaque film is set such that the peak ratio of light intensity of the subtracted portion to that of the non-subtracted portion is 0.9 or more.

(2) The phases of the adjacent transmitting portions differ from each other.

(3) The phases of the adjacent transmitting portions differ from each other by 180 degrees.

(4) The depth of the subtracted portion is so determined as to almost satisfy the relation of $\lambda\{2(n-1)\}$ in adjacent transmitting portions of subtracted and non-subtracted portions.

According to the first aspect of the present invention, the same waveguide effect can be produced in two openings through which exposure light is transmitted by setting the depth corresponding to an amount of subtraction as described above. Further, the symmetrical distribution of light intensity can be formed even in a defocus area by forming a difference of depths between adjacent recesses considering a phase velocity change of electromagnetic wave in a waveguide. Consequently, the intensities of light passing through both the openings can be made equal to each other, thus allowing a resist pattern free of a difference in size to be formed and, in this case, the pattern can easily be formed since no phase-shifting masks have to be formed. Since no protrusions are formed from the opaque film, the mechanical strength can be greatly increased.

According to the third aspect of the present invention, the same waveguide effect can be produced in two openings through which exposure light is transmitted by setting the thickness of the opaque film as described above. Thus, a difference in light intensity between the openings can be lessened, as can be a difference in size between resist patterns to be formed. Since, in this case, no phase-shifting masks have to be formed, there occurs no problems of a protrusion formed of the opaque film. In order to cause a phase difference between the exposure lights transmitted through adjacent transmitting portions, at least one of the transmitting portions is shaped like a recess, and the thickness x of the opaque film is set so as to fall within a range of $\lambda \leq x \leq 2\lambda$. Consequently, a phase-shifting photomask capable of transferring a high-resolution pattern can be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to the accompanying drawings.

First Embodiment

Figure 2:
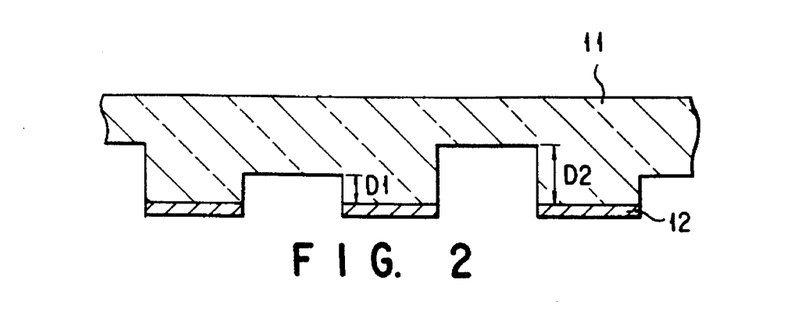
FIG. 2 is a cross-sectional view schematically showing a structure of a photomask according to a first embodiment of the present invention.

FIG. 2 is a cross-sectional view schematically showing a structure of a photomask according to a first embodiment of the present invention. As shown in FIG. 2, an opaque material 12 having opening patterns is formed on the undersurface of a transparent transmitting substrate 11 which transmits exposure light, and a portion of the substrate 11 corresponding to one opening pattern is etched to a depth $D_1$ and that of the substrate corresponding to another opening pattern is etched to a depth $D_2$. These depths $D_1$ and $D_2$ are set so as to satisfy the following equations:

$$D_1=(2m-1)\lambda/\{2(n-1)\}$$

$$D_2=m\lambda/(n-1)$$

where m is a positive integer, n is the refractive index of the transmitting substrate, and $\lambda$ is the wavelength of the exposure light. The following is thus obtained from the above equations:

$$|D_1-D_2|=\lambda/\{2(n-1)\}$$

It is understood from the equation that a phase difference of 180 degrees is caused between adjacent opening patterns. The basic constitution of a projection exposure system used in the first embodiment can be the same as that of the conventional system.

Figure 3A:
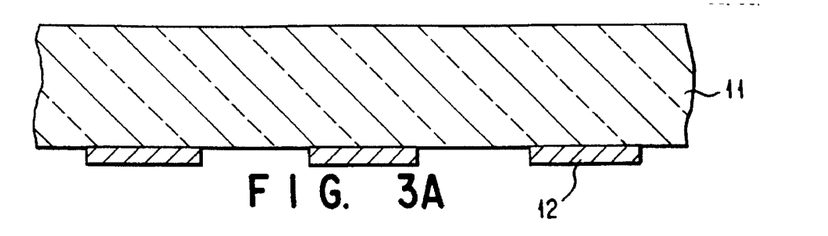
FIGS. 3A to 3E are stepwise cross-sectional views showing a process of manufacturing the photomask according to the first embodiment of the present invention.
Figure 3B:
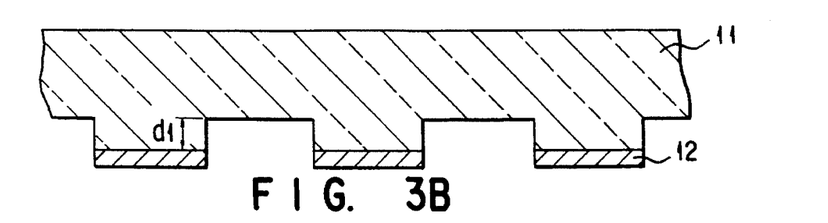

FIGS. 3A to 3E are stepwise cross-sectional views showing a process of manufacturing the photomask according to the first embodiment of the present invention. First a pattern of the opaque material 12 is formed on the undersurface of the transmitting substrate 11, as shown in FIG. 3A, and then the substrate 11 is selectively etched by anisotropic etching, such as RIE (reactive ion etching), using the opaque material 12 as an etching mask, as shown in FIG. 3B. The substrate is vertically etched to the depth $d_1$ given by the following:

$$d_1=(2m-1)\lambda/\{2(n-1)\}$$

Figure 3C:
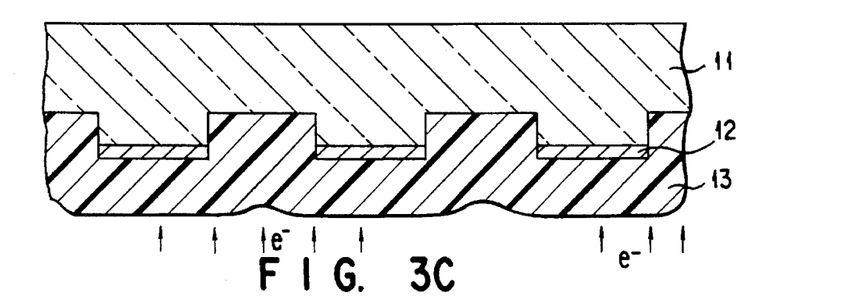
Figure 3D:
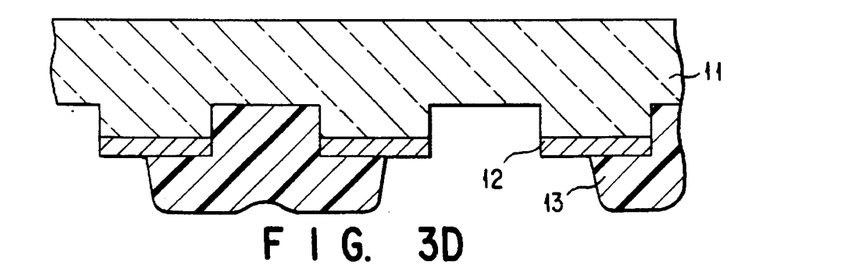

After that, as shown in FIG. 3C, a resist 13 is applied onto the entire undersurface of the substrate (i.e., opaque material formed surface), and then exposure and development are performed using charged particles (e.g., electrons) or light so that every other opening can be covered with a resist pattern, as shown in FIG. 3D. Using the resist 13 as an etching mask, the substrate 11 is selectively, vertically etched to the depth $d_2$ represented as follows:

$$d_2=\lambda/\{2(n-1)\}$$

Figure 3E:
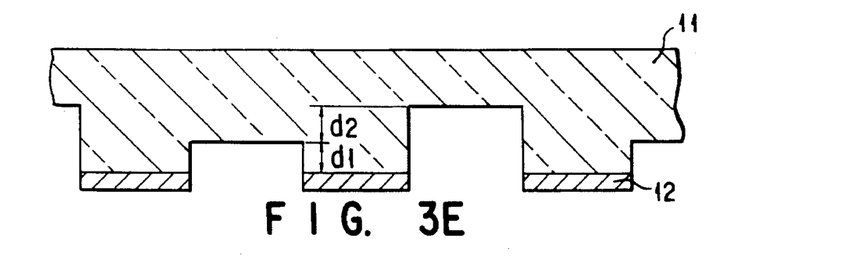

The depth $d_2$ corresponds to the distance $|D_1-D_2|$ causing the phase difference of 180 degrees. Finally, as shown in FIG. 3E, the resist 13 is removed. Therefore, the depths $D_1$ and $D_2$ of recesses of adjacent transmitting portions can be expressed as follows:

$$D_1 = d_1$$

$$D_2 = d_1 + d_2$$

The phase difference in light transmitted through the adjacent transmitting portions can thus be set to 180 degrees.

Figure 4A:
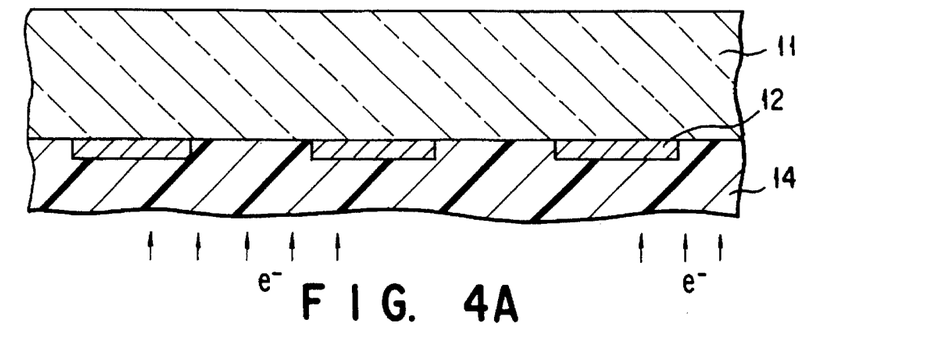
FIGS. 4A to 4D are stepwise cross-sectional views showing another process of manufacturing the photomask according to the first embodiment of the present invention.
Figure 4B:
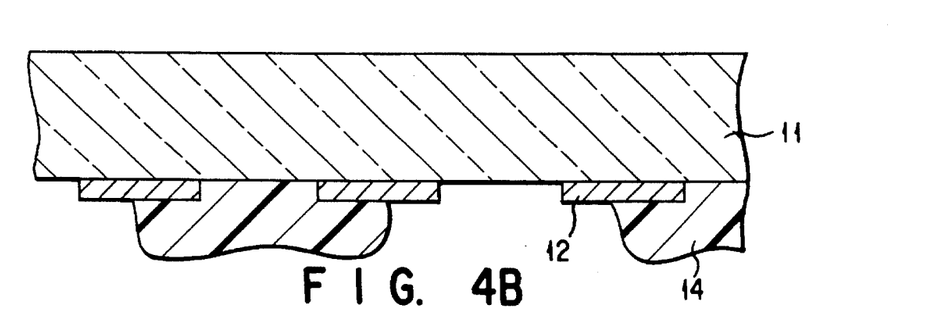

Another process of manufacturing the photomask according to the first embodiment of the present invention, will now be described, with reference to FIGS. 4A to 4D. First, as shown in FIG. 4A, a pattern of the opaque material 12 is formed on the undersurface of the transmitting substrate 11 and a resist 14 is applied onto the entire undersurface thereof. As shown in FIG. 4B, a resist pattern is formed so as to cover every other opening by exposure and development using charged particles or light.

Figure 4C:
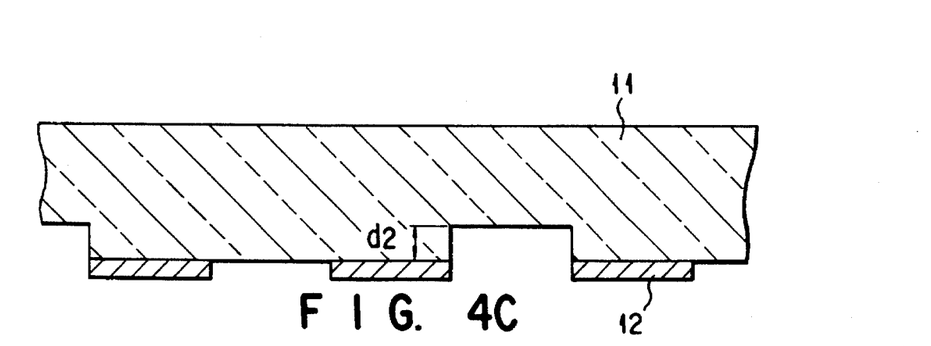
Figure 4D:
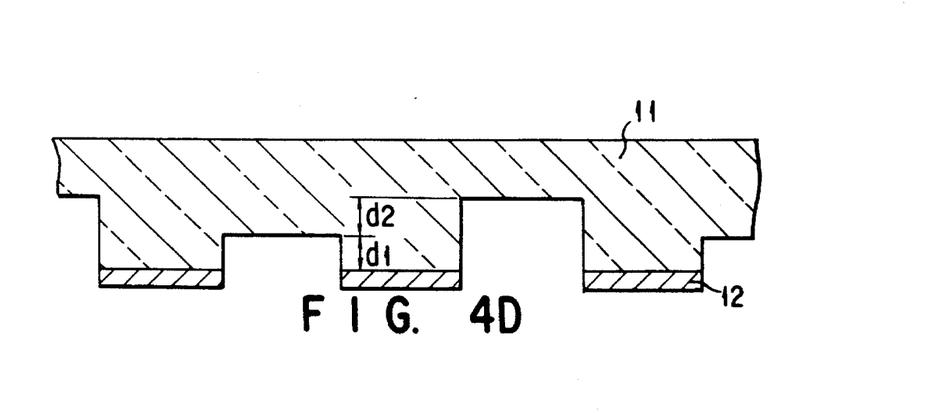

As shown in FIG. 4C, the substrate 11 is etched vertically to the depth $d_2$ by RIE using the resist 14 as an etching mask. After the resist 14 is removed and, as shown in FIG. 4D, the substrate 11 is etched vertically to the depth $d_1$ by RIE using the opaque material 12 as an etching mask, with the result that a photomask having the structure shown in FIG. 2 is obtained.

The depth $d_1$, which corresponds to an amount of etching for uniformly subtracted portions from the substrate 11, is given by the following equation:

$$d_1 = (2m-1)\lambda/\{2(n-1)\}$$

In this equation, it is desirable that m is equal to about 1. The etching amount has only to be set so as to substantially satisfy the equation. Moreover, the depth $d_2$, which corresponds to an amount of etching for causing a phase difference in an adjacent opening, is expressed as follows:

$$d_2 = \lambda/\{2(n-1)\}$$

This etching amount has only to be set so as to substantially satisfy the equation.

Figure 5:
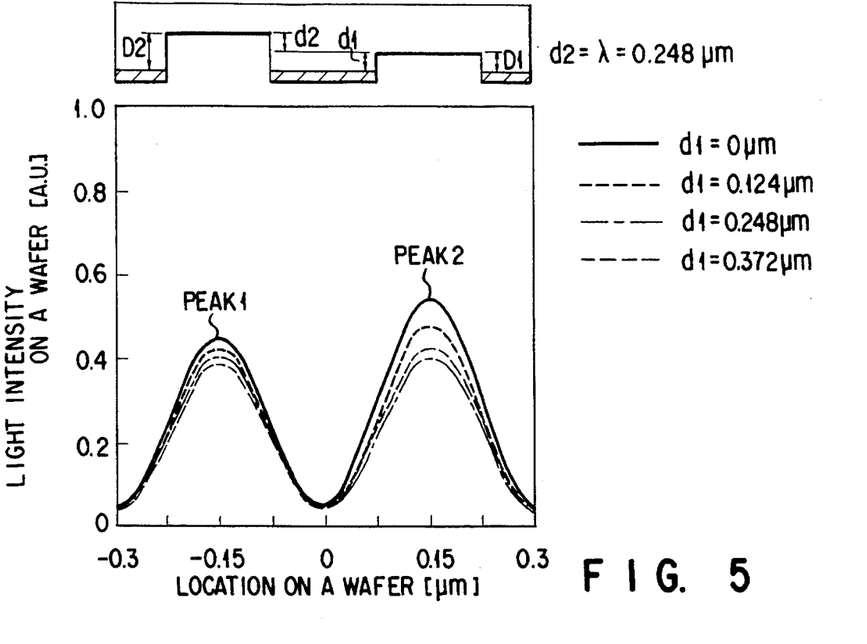
FIG. 5 is a characteristic diagram showing the distribution of light intensity on a wafer which is obtained by simulation in accordance with variations in amount of etching $d_1$.
Figure 6:
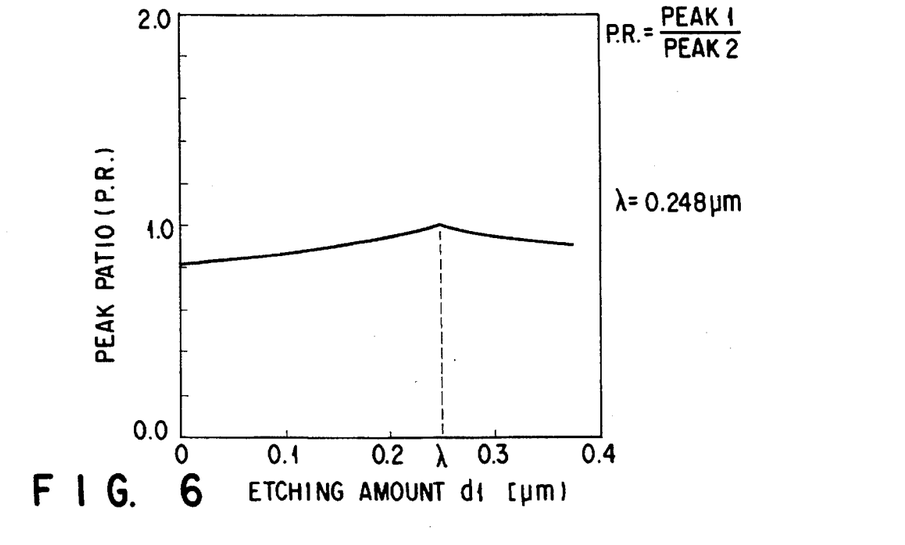
FIG. 6 is a characteristic diagram showing a relationship between the amount of etching $d_1$ and the peak ratio of light intensity to the thickness x of an opaque material.

FIGS. 5 and 6 show the results of simulation for the distribution of light intensity on a wafer when the photomask of the first embodiment is used. The following are parameters used for the simulation:

1) Reduction rate of an exposure device=⅕
2) Wavelength k of exposure light=248 nm (KrF excimer laser beam)
3) Numerical aperture (NA) of a projecting optical system=0.5
4) Coherence factor σ=0.3
5) 0.75 μm Line and Space (dimension on mask), Line:Space=1:1 (dimension ratio)
6) Refractive index n of the substrate=1.5
7) Refractive index n of the opaque material=2.5–2.0i
8) Thickness of opaque material=100 nm According to the simulation, the distribution of amplitudes and phases of light which has Just passed through the surface of a mask pattern relative to light vertically incident on the mask, is obtained directly by numeric calculation from the Maxwell equation, and the distribution of light intensity on the wafer is obtained by using the distribution of amplitudes and phases as the distribution of complex amplitude transmittance of the mask in the partially coherent imaging theory.

FIG. 5 shows the distribution of light intensity in accordance with the depth of subtracting amount $d_1$, which is obtained by varying the depth $d_1$ to which the openings are uniformly subtracted at first and fixing the depths $d_2$ constant to which every other opening is then subtracted. The abscissa of FIG. 5 indicates the location on a mask wafer and each location corresponds to that of the cross-sectional view of the mask wafer shown Just above the diagram. The light intensity is determined just at the focus position of the optical system. FIG. 6 shows how the ratio of peak 1 to peak 2 (P.R.) shown in FIG. 5 depends upon the depth (etching or subtracting amount) $d_1$.

The depth $d_1$ of 0 in FIG. 5 represents a conventional subtracting type phase-shifting mask and, in this case, a difference between peaks 1 and 2 is the widest and considered to be tile cause of a difference in resist sizes after development. The light intensity of peak 2 lowers as the depth $d_1$ increases, and peaks 1 and 2 become substantially equal to each other when $d_1 = d_2 = \lambda = 0.248$ μm. Since the refractive index n of quartz generally used as a substrate is 1.5, its optimum depth $d_1 = \lambda/\{2(n-1)\} = \lambda$. This calculation corresponds to the results of the above simulation.

According to the first embodiment described above, all the transmitting portions of the transmitting substrate are formed like a recess, a high-resolution resist pattern can be formed since the depths $D_1$ and $D_2$ of adjacent transmitting portions are set as follows, and the phase difference of 180 degrees is made between the adjacent transmitting portions:

$$D_1 = \lambda/\{2(n-1)\}$$

$$D_2 = 2D_1 = \lambda/(n-1)$$

Unlike the conventional shifter forming method, no phase-shifting film has to be formed, and the substrate has only to be etched; therefore, the mask is easy to form. Since all the transmitting portions are shaped like a recess, the waveguide effect produced from each transmitting portion can effectively be offset, and the difference in resist sizes can be lessened. The foregoing photomask has the advantage of being structurally strong without forming a protrusion of opaque material 12, unlike in the case of using isotropic etching.

The photomask of the first embodiment need not be necessarily manufactured by the process described above. For example, it can be manufactured by a combination of anisotropic etching with isotropic etching or by etching a transparent member uniformly formed on a substrate.

Second Embodiment

Figure 7:
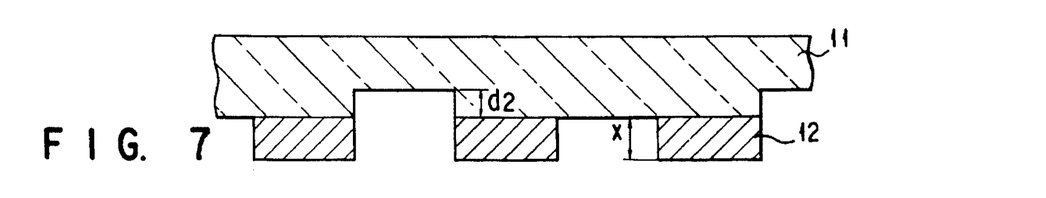
FIG. 7 is a cross-sectional view schematically showing a structure of a photomask according to a second embodiment of the present invention.

FIG. 7 is a cross-sectional view schematically showing a structure of a photomask according to a second embodiment of the present invention. In FIG. 7, the same structural elements as those of FIG. 2 are denoted by the same reference numerals, and their detailed descriptions are omitted. The basic constitution of a projection exposure system used in the second embodiment can be the same as that of the conventional system.

As shown in FIG. 7, an opaque material 12 having opening patterns is formed on the undersurface of a transmitting mask substrate 11, and a portion of the substrate 11 corresponding to one of adjacent opening patterns is vertically etched to a depth $d_2$. The thickness x of the opaque material 12 is three to five times as great as that (about 0.1 μm) of the opaque material of the prior art photomask.

Figure 8A:
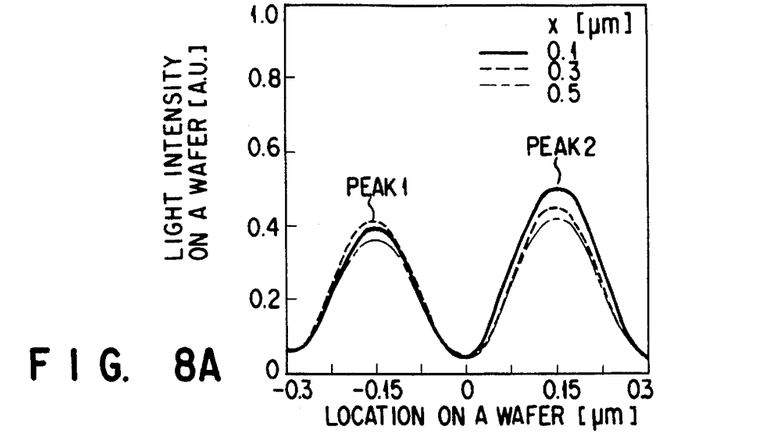
FIGS. 8A and 8B are characteristic diagrams showing the distribution of light intensity obtained with respect to the thickness x of the opaque material.
Figure 8B:
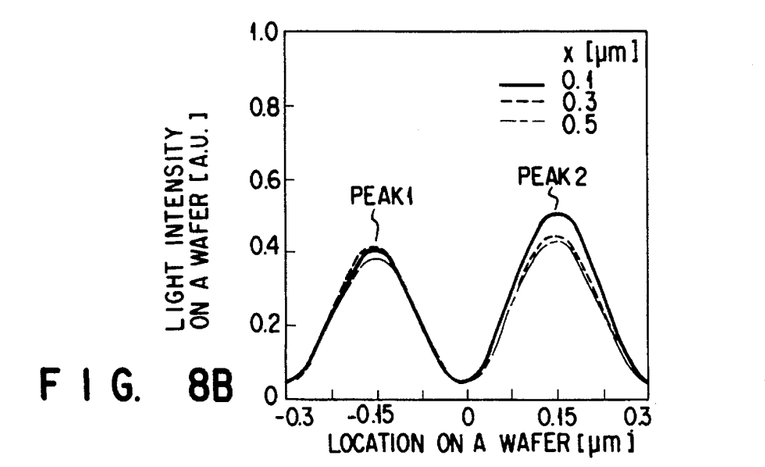

FIGS. 8A and 8B show the results of simulation for the distribution of light intensity on a wafer when the photomask of the second embodiment is used. The following are parameters for the simulation:

1) Reduction rate of an exposure device=⅕
2) Wavelength λ of exposure light=248 nm (KrF excimer laser beam)
3) Numerical aperture (NA) of a projecting optical system=0.5
4) Coherence factor σ=0.3
5) 0.75 μm Line and Space (dimension on mask), Line: Space=1:1 (dimension ratio)
6) Refractive index n of the mask substrate=1.5
7) Refractive index n of the opaque material In FIG. 8A, n=2.5–2.0i In FIG. 8B, n=4.0–2.0i According to the simulation, the distribution of amplitudes and phases of light which has just passed through the surface of a mask pattern relative to light vertically incident on the mask, is obtained directly by numeric calculation from the Maxwell equation, and the distribution of light intensity on the wafer is obtained by using the distribution of amplitudes and phases as the distribution of complex amplitude transmittance of the mask in the partially coherent imaging theory.

Figure 9:
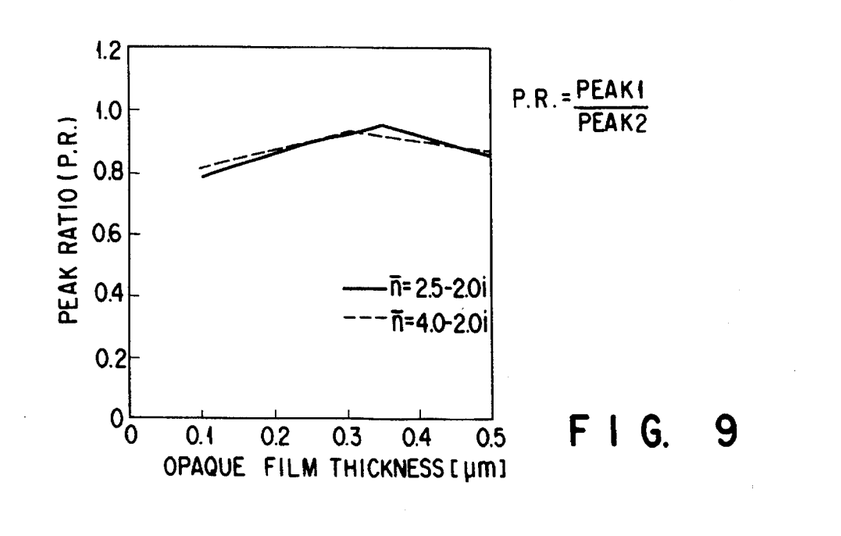
FIG. 9 is a characteristic diagram showing the peak ratio of the light intensity with respect to the thickness x of the opaque material.

FIGS. 8A and 8B shows the distribution of light intensity which is obtained from calculation for each of various thicknesses x of opaque materials. The light intensity is determined Just at the focus position of the optical system. In FIG. 8A, the refractive index n of the opaque material is 2.5–2.0i and, in FIG. 8B, 4.0–2.0i. FIG. 9 shows the peak ratio of the light intensity (corresponding to P.R. of FIG. 6) of adjacent openings with respect to each of various thicknesses x of the opaque material.

In the second embodiment, since the subtracting amount (depth) $d_1$ is set to 0, the thickness x of 0.1 μm in FIGS. 8A and 8B represents a conventional phase-shifting mask and, in this case, a difference between peak 1 of the light intensity of a subtracted portion and peak 2 of that of a non-subtracted portion is the greatest and considered to be the cause of a difference in resist size after development. As the thickness x increases, the light intensity (peak 2) of the nonsubtracted portion lowers, and the peaks 1 and 2 become substantially equal to each other when x=0.3 or 0.5 μm. It is understood from FIG. 9 that the peak ratio is approximately 0.9 or more when λ≦x≦2λ (λ=wavelength of exposure light=0.248 μm) and a difference in resist sizes can be decreased. It is also understood from calculation that the optimum thickness depends upon the refractive index and extinction coefficient of opaque material.

According to the second embodiment described above, the same waveguide effect can be produced in two openings by increasing in thickness x of the opaque material 12, with the result that a difference in the intensity of light transmitted through both the openings can be lessened, as can be a difference in the size of a resist pattern to be formed. Since no phase-shifting films have to be formed or no protrusions are formed of the opaque material 12, the same effect as that of the first embodiment can be obtained from the second embodiment.

Furthermore, no problems occur even if the present invention is applied to, for example, a mask formed by the conventional phase shifter method described above as well as a phase-shifting mask formed by the simply subtracted process of the foregoing embodiments. The opaque material can be replaced with a multilayered film each layer having different refractive index in its thickness direction.

Third Embodiment

A photomask according to a third embodiment of the present invention will now be described. In the first embodiment, the coincidence of peaks of the intensity of light transmitted through the wafer formed at the focus position of the optical system, is obtained from the simulation performed by strictly resolving the Maxwell equation. However, the inventors of the present invention did the calculation at a location shifted from the focus position, with the result that the distribution of light intensity varied up and down asymmetrically with respect to the focus position. This asymmetrical variation is caused by the fact that the phase velocity of the light passing through a recess is shifted from that of the light passing through free space by the waveguide effect. Consequently, a sufficient focus margin cannot be set by the above-described conditions of the first embodiment.

In the third embodiment, therefore, the depth of focus is evaluated in view of defocus to allow a pattern of high resolution and great depth of focus to be transferred.

The constitution of the photomask according to the third embodiment is the same as that of the photomask shown in FIG. 2. In the third embodiment, an opaque material 12 having opening patterns is formed on the undersurface of a transparent transmitting substrate 11 which transmits exposure light, and a portion of the substrate 11 corresponding to one opening pattern is etched to a depth $D_1$ and that of the substrate corresponding to another opening pattern is etched to a depth $D_2$. These depths $D_1$ and $D_2$ are so determined as to satisfy the following equations:

$$D_1=(2m-1)\lambda/\{2(n-1)\}+\delta 1$$

$$D_2=m\lambda/(n-1)+\delta 2$$

$$0\leq \delta 1-\delta 2<\lambda/\{16(n-1)\}$$

$$|\delta 1|, |\delta 2|<\lambda/\{16(n-1)\}$$

where m is a positive integer, n is the refractive index of the transparent transmitting substrate, and λ is the wavelength of the exposure light. The basic constitution of a projection exposure system used in the third embodiment can be the same as that of the conventional system. The photomask of the third embodiment can be formed by the method shown in FIGS. 3A to 3E or FIGS. 4A to 4D.

FIGS. 10A and 11A to 11D show the results of simulation for the distribution of light intensity on a wafer when the photomask of the third embodiment is used. The parameters used for the simulation are completely the same as those in the first embodiment.

According to the simulation, the distribution of amplitudes and phases of light which has just passed through the surface of a mask pattern relative to light vertically incident on the mask, is obtained directly by numeric calculation from the Maxwell equation, and the distribution of light intensity on the wafer is obtained by using the distribution of amplitudes and phases as the distribution of complex amplitude transmittance of the mask in the partially coherent imaging theory.

Figure 10A:
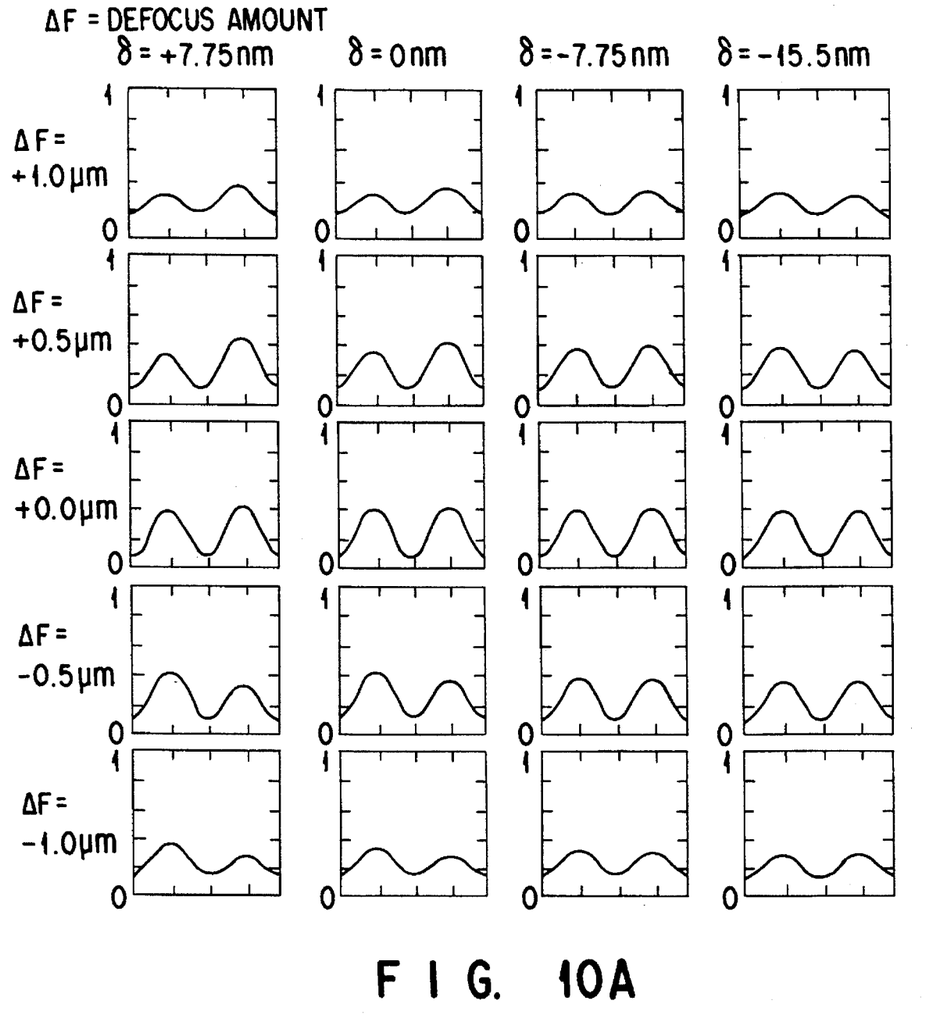
FIG. 10A is a characteristic diagram showing the defocus amount dependence of the distribution of light intensity on a wafer according to a third embodiment of the present invention.
Figure 10B:
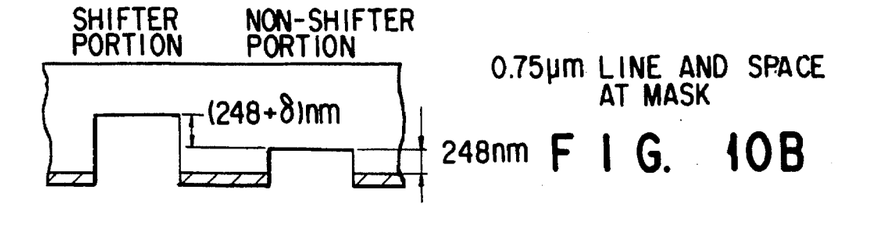
FIG. 10B is a cross-sectional view of the wafer showing the arrangement of the shifter and non-shifter portions.
Figure 11A:
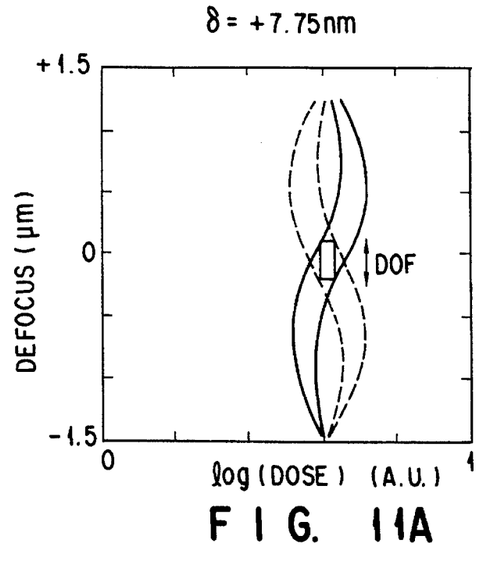
FIGS. 11A to 11d are characteristic diagrams of ED (exposure defocus) trees obtained from the distribution of light intensity on the wafer according to the third embodiment of the present invention.
Figure 11B:
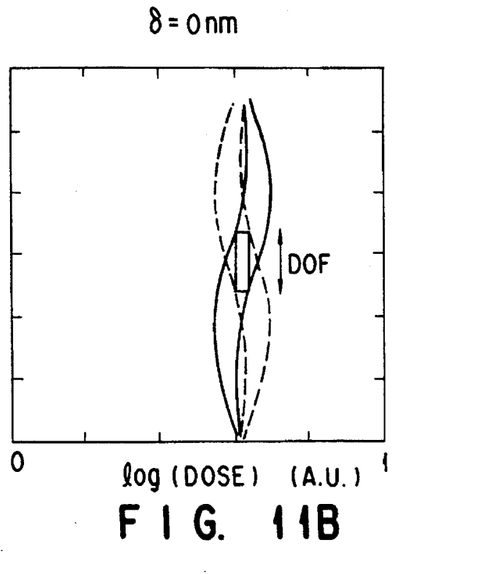
Figure 11C:
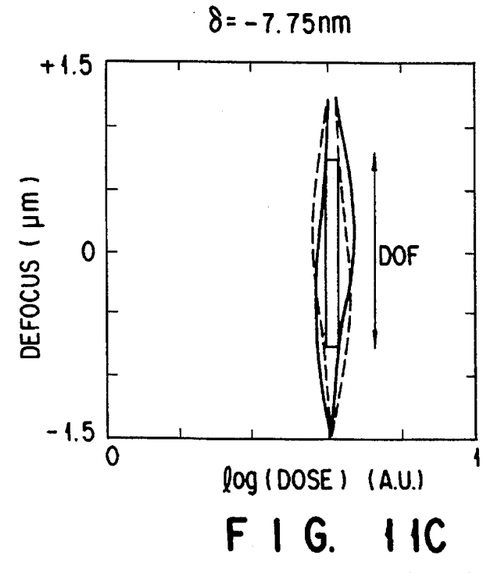
Figure 11D:
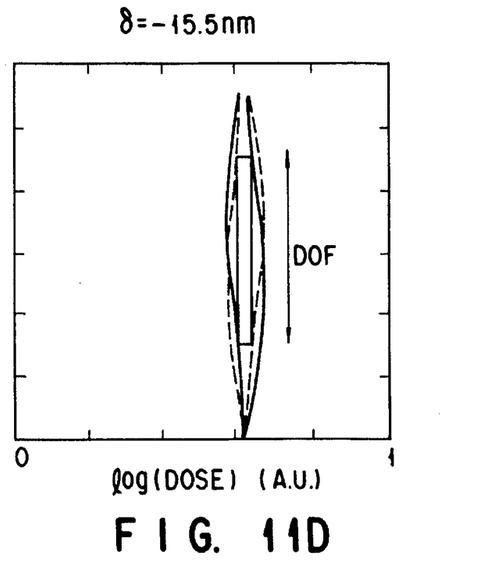

FIG. 10A shows the distribution of light intensity which is obtained from calculation for each of various values of δ, wherein the depth of a uniformly subtracted portion of an opening is 248 nm and the difference in depth between adjacent openings is 248+δ nm and each line and space is set to be 0.75 μm as shown in FIG. 10B. In each diagram shown in FIG. 10A, the abscissa indicates a location on the wafer, while the ordinate represents the defocus amount (ΔF). The unit is an arbitrary unit (A.U.). The two peak values of the light intensity of adjacent openings are equal at the focus position ($\Delta F$=0.0 µm), irrespective of the value of δ. However, when δ=0 nm, the two peak values are caused to differ in accordance with a shift of $\Delta F$ from 0.0 µm. when δ=7.75 nm, the difference between the peak values is increased further. When δ=–7.75 nm, the absolute values of the peak values vary with the shift of $\Delta F$, but the adjacent peak values are equal to each other. When δ=–15.5 nm, the two peak values are caused to differ from each other with a shift of $\Delta F$.

FIGS. 11A to 11D are diagrams each showing an ED (Exposure Defocus) tree. In each of the diagrams, the abscissa indicates a dose expressed by logarithm and the ordinate does a defocus amount ($\Delta F$), and a region surrounded with the solid line is a defocus and dose region wherein a line width varies within a range of ±10% of a predetermined value in a shifter portion, while a region surrounded with the broken line is a same defocus and dose region in a non-shifter portion. It is apparent from FIGS. 11A to 11D that a difference in line width between the shifter and non-shifter portions is minimized when δ is about –8 nm. It is understood that, if an allowable defocus amount is represented by DOF which corresponds to a vertical width of a rectangular window in each ED tree, wherein a margin for the dose is allowed up to 10%, the DOF is maximized when δ is about –8 nm.

According to the third embodiment described above, all the transmitting portions of the transmitting substrate are formed like a recess, and the depths $D_1$ and $D_2$ of adjacent transmitting portions are set as follows:

$$D_1=\lambda/2(n-1)=248 \text{ nm}$$

$$D_2=2D_1+\delta=2\times248-8=488 \text{ nm}$$

Therefore, a high-resolution resist pattern, which is capable of considerably reducing a difference in size due to a three-dimensional structure of the mask at the time of defocus, can be formed. No phase-shifting films have to be formed as in the first embodiment, and the photomask of the third embodiment can be manufactured more easily than using the conventional shifter forming method. The advantage of the third embodiment is that since all the transmitting portions are formed like a recess, a difference in size of resist patterns corresponding thereto can be reduced, and the finished photomask is structurally strong unlike in the case of using isotropic etching.

The present invention is not limited to the above embodiments, and various changes and modifications can be made without departing from the scope of the subject matter of the present invention. For example, a photomask can be manufactured by combination of the first and second embodiments and, in this case, a difference in resist pattern size can be reduced further by the synergistic effect of the transmitting portions all in the shape of a recess and the opaque material having great thickness x.

According to the foregoing present invention described in detail, a pattern having opaque and transmitting portions is formed on a transparent substrate which optically transmits exposure light, all the transmitting portions are shaped like a recess, and the depths of adjacent transmitting portions are caused to differ from each other. Consequently, a photomask and its manufacturing method can be achieved wherein a high-resolution pattern formed by the phase-shifting process can be transferred.

What is claimed is:

1. A transmitting photomask comprising:

an optically transparent substrate having a major surface, on which a plurality of recesses are selectively formed, and transmitting exposure light;

a plurality of opaque materials formed on portions of the major surface of said transparent substrate, other than said plurality of recesses, and preventing the exposure light from passing therethrough; and a plurality of transmitting portions constituted of said plurality of recesses, said plurality of recesses each having side walls formed perpendicular to the major surface of said transparent substrate so as to substantially coincide with a corresponding end face of each of said plurality of opaque materials, and adjacent transmitting portions having different depths, wherein, when a depth of a recess of one of said adjacent transmitting portions is $D_1$, a depth of a recess of the other of said adjacent transmitting portions is $D_2$, a refractive index of said transmitting substrate is n, a wavelength of said exposure light is X, and m is a positive integer, the depths $D_1$ and $D_2$ are set so as to substantially satisfy following equations:

$$D_1=(2m-1)\lambda/\{2(n-1)\}$$

$$D_2=m\lambda/(n-1).$$

2. The transmitting photomask according to claim 1, wherein a phase difference between said adjacent transmitting portions is about 180 degrees.

3. A transmitting photomask comprising:

an optically transparent substrate for transmitting exposure light;

a plurality of opaque materials selectively formed on said transparent substrate, for preventing the exposure light from passing therethrough; and a plurality of transmitting portions selectively formed on said transparent substrate, for transmitting the exposure light, at least one of adjacent transmitting portions being shaped like a recess to cause a phase difference between exposure lights passing through said adjacent transmitting portions, and a thickness x of each of said plurality of opaque materials being set within a following range with respect to a wavelength λ of the exposure light:

$$\lambda \leq x \leq 2\lambda.$$

4. The transmitting photomask according to claim 3, wherein the thickness x of each of said plurality of opaque materials is set such that a peak ratio of light intensity between the exposure lights passing through said adjacent transmitting portions is 0.9 or more.

5. The transmitting photomask according to claim 3, wherein a phase difference between said adjacent transmitting portions is about 180 degrees.

6. The transmitting photomask according to claim 3, said adjacent transmitting portions include a subtracted portion and a non-subtracted portion and, when a wavelength of the exposure light is λ and a refractive index of said transparent substrate is n, a depth of the subtracted portion is set to satisfy a relation of $\lambda/\{2(n-1)\}$.

7. A transmitting photomask comprising:

an optically transparent substrate having a major surface, on which a plurality of recesses are selectively formed, and transmitting exposure light;

a plurality of opaque materials formed on portions of the major surface of said transparent substrate, other than said plurality of recesses, and preventing the exposure light from passing therethrough; and a plurality of transmitting portions constituted of said plurality of recesses, said plurality of recesses each having side walls formed perpendicular to the major surface of said transparent substrate so as to substantially coincide with a corresponding end face of each of said plurality of opaque materials, and adjacent transmitting portions having different depths, wherein, when a depth of a recess of one of said adjacent transmitting portions is $D_1$, a depth of a recess of the other of said adjacent transmitting portions is $D_2$, a refractive index of said transmitting substrate is n, a wavelength of said exposure light is $\lambda$, and m is a positive integer, the depths $D_1$ and $D_2$ are set so as to substantially satisfy:

$|D_1 - D_2| = (2m-1)\lambda/\{2(n-1)\} - \delta$ $0 \leq \delta < \lambda/\{16(n-1)\}$.

8. A transmitting photomask comprising:

an optically transparent substrate having a major surface, on which a plurality of recesses are selectively formed, and transmitting exposure light;

a plurality of opaque materials formed on portions of the major surface of said transparent substrate, other than said plurality of recesses, and preventing the exposure light from passing therethrough; and a plurality of transmitting portions constituted of said plurality of recesses, said plurality of recesses each having side walls formed perpendicular to the major surface of said transparent substrate so as to substantially coincide with a corresponding end face of each of said plurality of opaque materials, and adjacent transmitting portions having different depths, wherein, when a depth of a recess of one of said adjacent transmitting portions is $D_1$, a depth of a recess of the other of said adjacent transmitting portions is $D_2$, a refractive index of said transmitting substrate is n, a wavelength of said exposure light is $\lambda$, and m is a positive integer, the depths $D_1$ and $D_2$ are set so as to satisfy:

$D_1 = (2m-1)\lambda/\{2(n-1)\} + \delta_1$ $D_2 = m\lambda/(n-1) + \delta_2$ $0 \leq \delta_1 - \delta_2 < \lambda/\{16(n-1)\}$ $|\delta_1|, |\delta_2| < \lambda/\{16(n-1)\}$.

\* \* \* \* \*